（12） United States Patent
Gonzalez et al.

(10) Patent No.: US 10,236,406 B2
(45) Date of Patent: Mar. 19, 2019

(54) SYSTEMS AND METHODS FOR TARGETED ANNEALING OF PHOTOVOLTAIC STRUCTURES

(71) Applicant: SolarCity Corporation, San Mateo, CA (US)

(72) Inventors: Pablo Gonzalez, Fremont, CA (US); Bobby Yang, Los Altos Hills, CA (US)

(73) Assignee: SolarCity Corporation, San Mateo, CA (US)

( * ) Notice: Subject to any disclaimer, the term of this patent is extended or adjusted under 35 U.S.C. 154(b) by 56 days.

(21) Appl. No.: 14/866,817

(22) Filed: Sep. 25, 2015

(65) Prior Publication Data
US 2016/0163910 A1    Jun. 9, 2016

Related U.S. Application Data

(60) Provisional application No. 62/143,694, filed on Apr. 6, 2015, provisional application No. 62/088,509, filed on Dec. 5, 2014.

(51) Int. Cl.
H01L 31/18 (2006.01)
H01L 31/05 (2014.01)
(Continued)

(52) U.S. Cl.
CPC ...... H01L 31/1864 (2013.01); H01L 31/0504 (2013.01); H01L 31/188 (2013.01);
(Continued)

(58) Field of Classification Search
CPC .......................... H01L 31/1664; H05K 3/1283
See application file for complete search history.

(56) References Cited

U.S. PATENT DOCUMENTS 2,938,938 A    5/1960   Dickson, Jr.
3,116,171 A   12/1963   Nielsen et al.
(Continued)

FOREIGN PATENT DOCUMENTS

DE    4030713 A1   4/1992
EP    2362430 A1   8/2011
(Continued)

OTHER PUBLICATIONS

International Search Report dated Apr. 13, 2016, for the corresponding International Patent Application No. PCT/US2015/064136, 6 pages.
(Continued)

Primary Examiner — Yu-Hsi D Sun
(74) Attorney, Agent, or Firm — Kilpatrick Townsend & Stockton LLP

(57) ABSTRACT

A targeted-annealing system can automatically cure a conductive paste that may bind cascaded strips of a string. The targeted-annealing system can include a first heat-treating bar that may be heated to a first curing temperature, and can include a second heat-treating bar that may be heated to a second curing temperature. During operation, a controller of the targeted-annealing system can activate one or more actuators to conform the first heat-treating bar to a top surface of two cascaded strips, and conform the second heat-treating bar to a bottom surface of two cascaded strips. The first and second heat-treating bars may be aligned along an overlap portion between the two cascaded strips, and can heat the overlap portion to 160 degrees Celsius.

12 Claims, 14 Drawing Sheets

(51) Int. Cl.
*H05K 3/12* (2006.01)
*H01L 21/67* (2006.01)

(52) U.S. Cl.
CPC ...... *H05K 3/1283* (2013.01); *H01L 21/67103* (2013.01); *Y02E 10/50* (2013.01)

(56) References Cited

U.S. PATENT DOCUMENTS

| | | |
|---|---|---|
| 3,459,597 A | 8/1969 | Baron |
| 4,577,051 A | 3/1986 | Hartman |
| 4,652,693 A | 3/1987 | Bar-On |
| 4,877,460 A | 10/1989 | Flödl |
| 5,118,361 A | 6/1992 | Fraas et al. |
| 5,178,685 A | 1/1993 | Borenstein et al. |
| 6,232,545 B1 | 5/2001 | Samaras et al. |
| 6,303,853 B1 | 10/2001 | Fraas et al. |
| 6,369,316 B1 | 4/2002 | Plessing et al. |
| 6,441,297 B1 | 8/2002 | Keller et al. |
| 6,538,193 B1 | 3/2003 | Fraas |
| 6,620,645 B2 | 9/2003 | Chandra et al. |
| 6,803,513 B2 | 10/2004 | Beernink et al. |
| 7,328,534 B2 | 2/2008 | Dinwoodie |
| 7,388,146 B2 | 6/2008 | Fraas et al. |
| 7,635,810 B2 | 12/2009 | Luch |
| 7,749,351 B2 | 7/2010 | Kataoka et al. |
| 7,749,883 B2 | 7/2010 | Meeus |
| 7,772,484 B2 | 8/2010 | Li et al. |
| 7,777,128 B2 | 8/2010 | Montello et al. |
| 7,825,329 B2 | 11/2010 | Basol |
| 7,829,781 B2 | 11/2010 | Montello et al. |
| 7,829,785 B2 | 11/2010 | Basol |
| 7,872,192 B1 | 1/2011 | Fraas et al. |
| 7,872,193 B2 | 1/2011 | Ogawa et al. |
| 7,998,760 B2 | 8/2011 | Tabe |
| 8,152,044 B2 | 4/2012 | Kawagoe et al. |
| 8,168,880 B2 | 5/2012 | Jacobs |
| 8,209,920 B2 | 7/2012 | Krause et al. |
| 8,222,513 B2 | 7/2012 | Luch |
| 8,298,363 B2 | 10/2012 | Hashimoto et al. |
| 8,343,795 B2 | 1/2013 | Luo et al. |
| 8,586,857 B2 | 11/2013 | Everson et al. |
| 8,735,206 B2 | 5/2014 | Sumitomo et al. |
| 2003/0000571 A1 | 1/2003 | Wakuda et al. |
| 2003/0201007 A1 | 10/2003 | Fraas et al. |
| 2005/0257823 A1 | 11/2005 | Zwanenburg |
| 2007/0283997 A1 | 12/2007 | Hachtmann et al. |
| 2010/0043863 A1 | 2/2010 | Wudu et al. |
| 2010/0147364 A1 | 6/2010 | Gonzalez et al. |
| 2010/0193014 A1 | 8/2010 | Johnson et al. |
| 2010/0218799 A1 | 9/2010 | Stefani |
| 2010/0224230 A1 | 9/2010 | Luch et al. |
| 2011/0156188 A1 | 6/2011 | Tu et al. |
| 2011/0259419 A1 | 10/2011 | Hagemann et al. |
| 2012/0000502 A1 | 1/2012 | Wiedeman et al. |
| 2012/0040487 A1 | 2/2012 | Asthana et al. |
| 2012/0060911 A1 | 3/2012 | Fu et al. |
| 2012/0125391 A1 | 5/2012 | Pinarbasi et al. |
| 2012/0152349 A1 | 6/2012 | Cao et al. |
| 2012/0240985 A1 | 9/2012 | Hashimoto |
| 2012/0240995 A1 | 9/2012 | Coakley |
| 2012/0248497 A1 | 10/2012 | Zhou et al. |
| 2012/0279548 A1 | 11/2012 | Münch et al. |
| 2012/0288983 A1 | 11/2012 | Chu et al. |
| 2012/0318319 A1 | 12/2012 | Pinarbasi et al. |
| 2012/0318340 A1 | 12/2012 | Heng et al. |
| 2012/0325282 A1 | 12/2012 | Snow et al. |
| 2013/0096710 A1 | 4/2013 | Pinarbasi et al. |
| 2013/0152996 A1 | 6/2013 | DeGroot et al. |
| 2013/0206213 A1 | 8/2013 | He et al. |
| 2013/0206221 A1 | 8/2013 | Gannon et al. |
| 2013/0237000 A1 | 9/2013 | Tabe et al. |
| 2013/0340813 A1 | 12/2013 | Momozaki et al. |
| 2014/0124014 A1 | 5/2014 | Morad et al. |
| 2014/0134777 A1 | 5/2014 | Hashimoto |
| 2014/0150844 A1 | 6/2014 | Azechi et al. |
| 2014/0196768 A1 | 7/2014 | Heng et al. |
| 2015/0090314 A1 | 4/2015 | Yang et al. |
| 2015/0270410 A1 | 9/2015 | Heng et al. |
| 2015/0349145 A1 | 12/2015 | Morad et al. |
| 2015/0349153 A1 | 12/2015 | Morad et al. |
| 2015/0349161 A1 | 12/2015 | Morad et al. |
| 2015/0349162 A1 | 12/2015 | Morad et al. |
| 2015/0349167 A1 | 12/2015 | Morad et al. |
| 2015/0349168 A1 | 12/2015 | Morad et al. |
| 2015/0349169 A1 | 12/2015 | Morad et al. |
| 2015/0349170 A1 | 12/2015 | Morad et al. |
| 2015/0349171 A1 | 12/2015 | Morad et al. |
| 2015/0349172 A1 | 12/2015 | Morad et al. |
| 2015/0349173 A1 | 12/2015 | Morad et al. |
| 2015/0349174 A1 | 12/2015 | Morad et al. |
| 2015/0349175 A1 | 12/2015 | Morad et al. |
| 2015/0349176 A1 | 12/2015 | Morad et al. |
| 2015/0349190 A1 | 12/2015 | Morad et al. |
| 2015/0349193 A1 | 12/2015 | Morad et al. |
| 2015/0349701 A1 | 12/2015 | Morad et al. |
| 2015/0349702 A1 | 12/2015 | Morad et al. |
| 2015/0349703 A1 | 12/2015 | Morad et al. |
| 2016/0163909 A1* | 6/2016 | Gonzalez ............ H01L 31/0504 29/25.01 |
| 2016/0163914 A1* | 6/2016 | Gonzalez ........ H01L 31/022433 156/272.8 |

FOREIGN PATENT DOCUMENTS

| | | | |
|---|---|---|---|
| EP | 2 439 782 A1 | 4/2012 | |
| EP | 2 634 818 A1 | 9/2013 | |
| EP | 2634818 A1 * | 9/2013 | ............ H01L 31/18 |
| WO | 2008/089657 A1 | 7/2008 | |
| WO | 2008/152678 A1 | 12/2008 | |
| WO | 2012/087462 A1 | 6/2012 | |
| WO | 2013/020590 A1 | 2/2013 | |
| WO | 2014/002229 A1 | 1/2014 | |
| WO | 2014/074826 A1 | 5/2014 | |

OTHER PUBLICATIONS

Written Opinion dated Apr. 13, 2016, for the corresponding International Patent Application No. PCT/US2015/064136, 7 pages.

* cited by examiner

SYSTEMS AND METHODS FOR TARGETED ANNEALING OF PHOTOVOLTAIC STRUCTURES

CROSS-REFERENCE TO OTHER APPLICATIONS

This claims the benefit of U.S. Provisional Patent Application No. 62/088,509, entitled "SYSTEM, METHOD, AND APPARATUS FOR AUTOMATIC MANUFACTURING OF SOLAR PANELS," filed Dec. 5, 2014; and U.S. Provisional Patent Application No. 62/143,694, entitled "SYSTEMS AND METHODS FOR PRECISION AUTOMATION OF MANUFACTURING SOLAR PANELS," filed Apr. 6, 2015, disclosures of which are incorporated herein by reference in their entirety for all purposes.

This is related to U.S. patent application Ser. No. 14/563,867, entitled "HIGH EFFICIENCY SOLAR PANEL," filed Dec. 8, 2014; and U.S. patent application Ser. No. 14/510,008, entitled "MODULE FABRICATION OF SOLAR CELLS WITH LOW RESISTIVITY ELECTRODES," filed Oct. 8, 2014, the disclosures of which are incorporated herein by reference in its entirety for all purposes.

FIELD OF THE INVENTION

This relates to solar panel fabrication, including annealing targeted segments of overlapping strips to cure a conductive paste that binds the overlapping strips to form a string.

DEFINITIONS

"Solar cell" or "cell" is a photovoltaic structure capable of converting light into electricity. A cell may have any size and any shape, and may be created from a variety of materials. For example, a solar cell may be a photovoltaic structure fabricated on a silicon wafer or one or more thin films on a substrate material (e.g., glass, plastic, or any other material capable of supporting the photovoltaic structure), or a combination thereof.

A "solar cell strip," "photovoltaic strip," or "strip" is a portion or segment of a photovoltaic structure, such as a solar cell. A solar cell may be divided into a number of strips. A strip may have any shape and any size. The width and length of a strip may be the same or different from each other. Strips may be formed by further dividing a previously divided strip.

A "cascade" is a physical arrangement of solar cells or strips that are electrically coupled via electrodes on or near their edges. There are many ways to physically connect adjacent photovoltaic structures. One way is to physically overlap them at or near the edges (e.g., one edge on the positive side and another edge on the negative side) of adjacent structures. This overlapping process is sometimes referred to as "shingling." Two or more cascading photovoltaic structures or strips can be referred to as a "cascaded string," or more simply as a string.

"Finger lines," "finger electrodes," and "fingers" refer to elongated, electrically conductive (e.g., metallic) electrodes of a photovoltaic structure for collecting carriers.

A "busbar," "bus line," or "bus electrode" refers to an elongated, electrically conductive (e.g., metallic) electrode of a photovoltaic structure for aggregating current collected by two or more finger lines. A busbar is usually wider than a finger line, and can be deposited or otherwise positioned anywhere on or within the photovoltaic structure. A single photovoltaic structure may have one or more busbars.

A "photovoltaic structure" can refer to a solar cell, a segment, or solar cell strip. A photovoltaic structure is not limited to a device fabricated by a particular method. For example, a photovoltaic structure can be a crystalline silicon-based solar cell, a thin film solar cell, an amorphous silicon-based solar cell, a poly-crystalline silicon-based solar cell, or a strip thereof.

BACKGROUND

Advances in photovoltaic technology, which are used to make solar panels, have helped solar energy gain mass appeal among those wishing to reduce their carbon footprint and decrease their monthly energy costs. However, the panels are typically fabricated manually, which is a time-consuming and error-prone process that makes it costly to mass-produce reliable solar panels.

Solar panels typically include one or more strings of complete solar cells. Adjacent solar cells in a string may overlap one another in a cascading arrangement. For example, continuous strings of solar cells that form a solar panel are described in U.S. patent application Ser. No. 14/510,008, filed Oct. 8, 2014 and entitled "Module Fabrication of Solar Cells with Low Resistivity Electrodes," the disclosure of which is incorporated herein by reference in its entirety. Producing solar panels with a cascaded cell arrangement can reduce the resistance due to inter-connections between the strips, and can increase the number of solar cells that can fit into a solar panel.

One method of making such a panel includes sequentially connecting the busbars of adjacent cells and combining them. One type of panel (as described in the above-noted patent application) includes a series of cascaded strips created by dividing complete solar cells into strips, and then cascading the strips to form one or more strings.

Precise and consistent division of solar cells into strips and alignment of strips or cells when forming a cascade arrangement is critical to ensure proper electrical and physical connections, but such alignment can be difficult to reliably achieve in high volumes if performed manually.

SUMMARY

One embodiment provides a targeted-annealing system that can automatically cure a conductive paste to bind cascaded strips of photovoltaic structures that form a string. The targeted-annealing system can include a set of heat-treating bars that may be heated to a curing temperature. When the bars move near or in contact with a surface of the overlapping photovoltaic structures, the heat can cure the conductive paste to bond the two overlapping photovoltaic structures. For example, a controller of the targeted-annealing system can activate an actuator to conform a first set of heat-treating bars to one surface of the overlapping photovoltaic structures (e.g., a top surface). In some embodiments, the controller can also activate another actuator to conform a second set of heat-treating bars to an opposing surface of the photovoltaic structures (e.g., a bottom surface). The first set of heat-treating bars may be heated to a first curing temperature, and the second set of heat-treating bars may be heated to a second curing temperature that may be the same or different than that of the first set of heat-treating bars. The two sets of heat-treating bars may be aligned along the overlapping section between the two photovoltaic structures.

In some embodiments, a respective heat-treating bar may include a compression spring that may supply compression between the heat-treating bar and a corresponding actuator while the corresponding actuator presses the respective heat-treating bar against the cascaded strips.

In some embodiments, the targeted-annealing system may also include a string platform operable to support the two cascaded strips, such that the platform can include at least one opening that may allow the second heat-treating bar access to the bottom surface of the two cascaded strips.

In some embodiments, the string platform may include a series of two or more openings with spacing that may be equal to a spacing between neighboring overlapping sections of a string of cascaded strips.

In some embodiments, the first heat-treating bar may be oriented overhead the string platform, and the second heat-treating bar may be oriented below the string platform.

In some embodiments, the first heat-treating bar may be mounted to a bottom surface of an overhead platform that can include a plurality of heat-treating bars oriented overhead the string platform.

In some embodiments, the second heat-treating bar may be mounted on an underside platform that can include a plurality of heat-treating bars oriented below the string platform.

In some embodiments, the targeted-annealing system can include an actuator that may move the string platform to align another overlapping section of a string of cascaded strips to the first and second heat-treating bars.

In some embodiments, the targeted-annealing system can include an actuator that may move the first and second heat-treating bars to align with another overlapping section of a string of cascaded strips.

In some embodiments, a respective heat-treating bar may include an electric heat source, which may heat a surface of the respective heat-treating bar to a target curing temperature.

In some embodiments, the first curing temperature or the second curing temperature may be approximately 160 degrees Celsius.

In some embodiments, the targeted-annealing system can include at least one fan that may prevent the heat-treating bar from reaching a temperature above an upper threshold.

DETAILED DESCRIPTION

The following description is presented to enable any person skilled in the art to make and use the embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present disclosure.

Thus, the invention is not limited to the embodiments shown, but is to be accorded the widest scope consistent with the principles and features disclosed herein.

Overview

A targeted-annealing system is provided that can automatically cure conductive paste to bind overlapping strips of photovoltaic structures along their busbars without significantly damaging the photovoltaic structures. The targeted-annealing system can operate within an automated assembly line that can manufacture complete solar panels that may include multiple strings of cascaded strips.

The targeted-annealing system can process strings of cascaded strips on an annealing platform, and in some embodiments, can anneal the conductive paste between overlapping strips either by applying heat to the top surface, to the bottom surface, or to the top and bottom surface. Later stages of the solar-panel assembly line may combine multiple of these strings to produce a solar panel.

The targeted-annealing system may prevent causing significant damage to a photovoltaic structure that may occur from bonding two strips using an electrically conductive material, such as when applying heat to cure the conductive paste. The unique design of the targeted-annealing system can allow targeted application of heat to only the areas of the string that needs to be cured. Furthermore, the targeted-annealing system can calibrate the temperature of the heat-treating bars and the amount of time that the heat-treating bars may apply heat to the surface of the photovoltaic structures (e.g., by touching the photovoltaic structure's surface) to achieve an optimum level of curing.

Figure 1A:
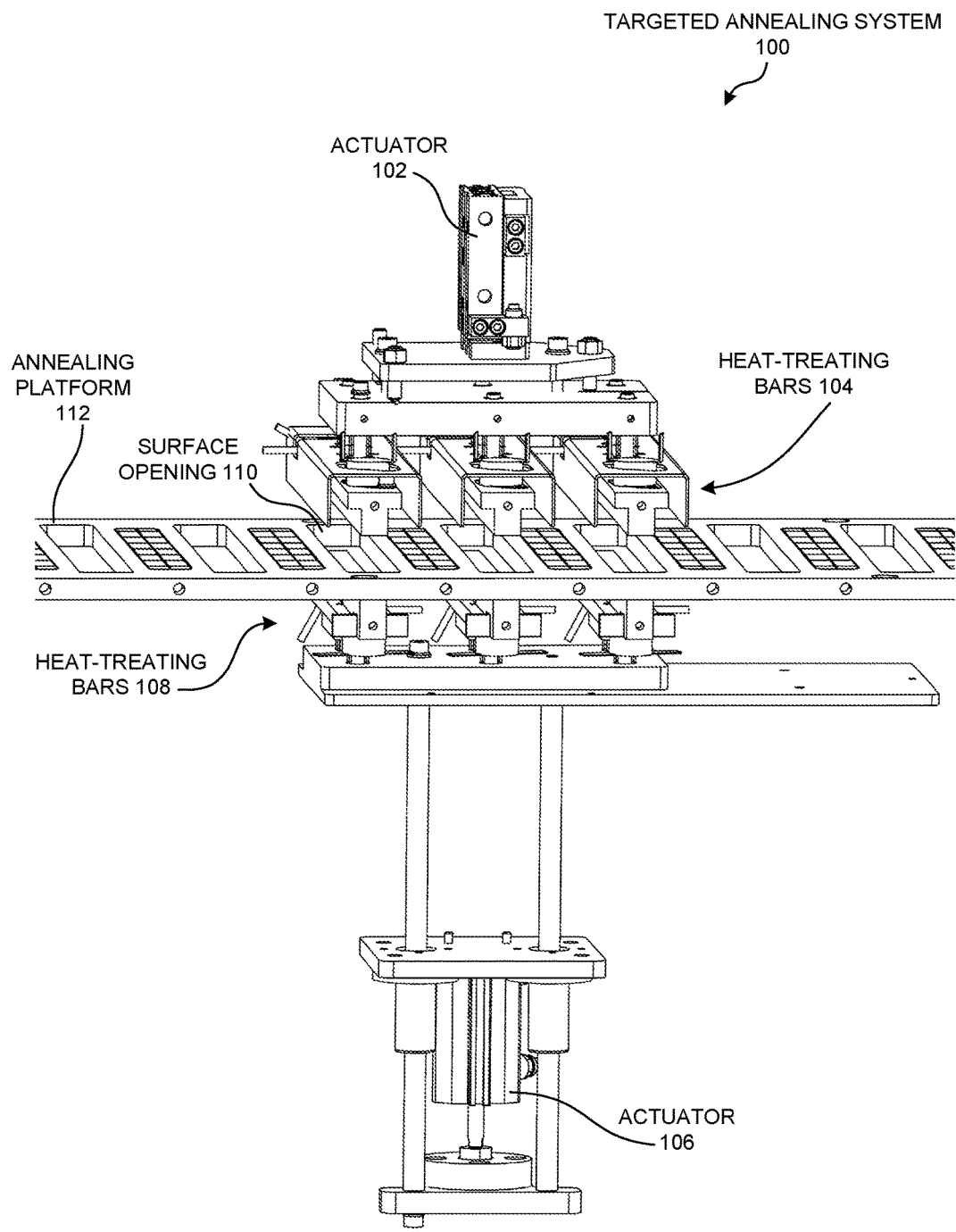
FIG. 1A shows a targeted-annealing system, according to one embodiment of the invention.

FIG. 1A shows targeted-annealing system 100, according to one embodiment of the invention. Targeted-annealing system 100 can include a set of heat-treating bars that can come in contact with a surface of two overlapping solar cell strips to cure a conductive bonding agent, such as a conductive paste, that may bond together busbars of the two strips. In some embodiments, solder can be deposited on a busbar of one strip (e.g., the bottom strip), and a heat-treating bar can apply heat to a strip surface (e.g., at least the top strip) to cause the solder to melt and adhere to the busbars of the two overlapping strips. However, one technical advantage in connecting the busbars via a conductive paste is that it can allow the string to be more flexible than if solder were used. Once deployed, solar panels can go through "thermal cycling" during a 24-hour period as the temperature changes throughout the day. The thermal cycling can exert pressure on the structure of the cascaded strips. The conductive paste can allow the string to withstand the structural stress that may be caused by the thermal cycling.

In some embodiments, the busbars may have an internal channel that can form a recessed surface inside the busbars, and can act as a receptacle to house a viscous adhesive. In some other embodiments, the busbars may have several grooves that may be formed via a mask at the time the busbar is formed on the surface of the photovoltaic structure. Each set of grooves can be placed on a location within the busbar where the fingers intersect the busbar. Each of the grooves can act as a receptacle that can contain the conductive paste. When the two strips are overlapped (e.g., "cascaded"), the channels and/or grooves inside each busbar can form a housing that may keep the conductive paste within the boundary of the busbars, and may prevent an overflow from the sides.

In some embodiments, targeted-annealing system 100 can include a set of heat-treating bars 108 that may be vertically aligned with another set of heat-treating bars 104, such that heat-treating bars 104 and 108 can heat opposing sides of the overlapping strips. Annealing platform 112 can shift to align the overlapping strip portions of a string with heat-treating bars 104 and 108. Then, a controller of targeted-annealing system 100 can conform heat-treating bars 104 and 108 to the top and bottom strips, respectively, to cure the conductive paste between the overlapping strips. For example, actuator 102 can move, such as lower, heat-treating bars 104 toward a top surface of the overlapping strips. Also, actuator 106 can move, such as raise, heat-treating bars 108 to pass through surface openings of annealing platform 112 (e.g., through surface opening 110), and heat a bottom surface of the overlapping strips (e.g., by making contact with the bottom surface).

Once heat-treating bars 104 and 108 are sufficiently close to the top and bottom surfaces of the string to cure the conductive paste, targeted-annealing system 100 can continue to heat the string surfaces for a predetermined curing duration necessary. In some embodiments, heat-treating bars 104 and 108 are heated to 160 degrees Celsius. Applying the heat for the predetermined curing duration can cause the paste in between busbars of the strips to cure. For example, the conductive paste may be in a form of a resin that can include one or more types of conductive particles. The conductive particles may be coated with a protection layer that can evaporate when the paste is thermally cured, and can thereby result in electrical conductivity between the conductive particles suspended inside the resin.

Figure 1B:
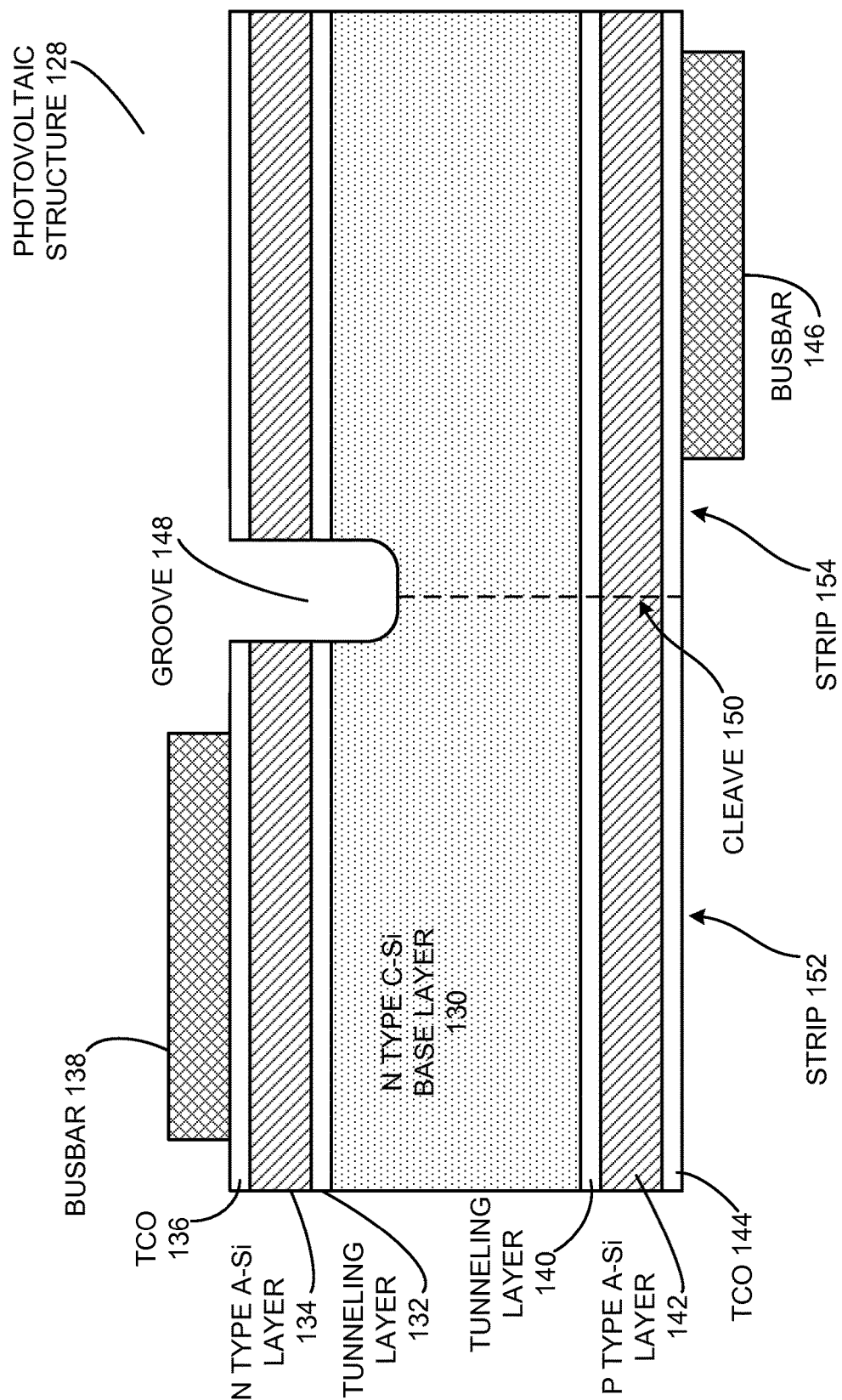
FIG. 1B shows one example of a photovoltaic structure before being divided into multiple strips, according to one embodiment of the invention.

FIG. 1B shows one example of a photovoltaic structure before being divided into multiple strips, according to one embodiment of the invention. Photovoltaic structure 128 in this example can include N type lightly doped crystalline silicon (c-Si) base layer 130, intrinsic tunneling layer 132, N type heavily doped amorphous silicon (a-Si) surface field layer 134, transparent conductive oxide (TCO) layer 136, and front-side busbar 138. On the backside, the structure can include intrinsic tunneling layer 140, P type a-Si emitter layer 142, TCO layer 144, and backside busbar 146. The backside tunneling junction, formed by P type a-Si emitter layer 140, intrinsic tunneling layer 140, and N type c-Si base layer 130, can transport away the majority carriers generated by base layer 130. The front side tunneling junction, formed by N type heavily doped a-Si surface field layer 134, intrinsic tunneling layer 132, and base layer 130, can transport away the minority carriers generated by base layer 130, thereby reducing the amount of carrier recombination in base layer 130. Tunneling layers 132 and 140 can passivate the interface between base layer 130 and the two heavily doped a-Si layers while still allowing carriers generated by base layer 130 to enter these a-Si layers due to tunneling effect.

The tunneling junction between base layer 130 and emitter layer 142 is where the majority carriers are removed. It is therefore preferable that damage to this interface is kept small, such as damage caused by scribing groove 148, handling photovoltaic structure 128, or cleaving photovoltaic structure 128 along groove 148 to produce strips 152 and 154 (e.g., by producing cleave 150). For example, applying too much heat to photovoltaic structure 128 may damage the tunneling junction between base layer 130 and emitter layer 142, which may decrease the amount of current that can be produced by photovoltaic structure 28. It is therefore preferable to only apply heat to surface portions of photovoltaic structure 128 that are near the conductive paste. For example, conductive paste can be applied to busbar 138 of strip 152, and strip 154 can be layered on top of strip 152 after photovoltaic structure 128 is cleaved along groove 148 so that busbar 146 is layered on top of busbar 138. Then, heat-treating bars can be used to apply heat to a top surface of strip 154 and/or to a bottom surface of strip 152 (e.g., above and/or below busbars 138 and 146) to anneal the conductive paste without applying significant heat to the remaining portions of photovoltaic structure 128 Annealing the conductive paste can bind busbars 138 and 146 together to hold the cascaded arrangement of a string. More details of an exemplary photovoltaic structure are provided in U.S. patent application Ser. No. 13/601,441, filed Aug. 31, 2012, entitled "BACK JUNCTION SOLAR CELL WITH TUNNEL OXIDE," the disclosure of which is hereby incorporated by reference in its entirety herein.

Exemplary photovoltaic structure 128 shown in FIG. 1B includes an N type lightly doped c-Si base layer. In general, the base layer can be either N or P type doped, or undoped, and can be made of a variety of materials, including c-Si, a-Si, poly-crystalline silicon, or non-silicon materials. Various device structures and designs based on different materials can also be used to construct the photovoltaic structure. For example, the photovoltaic structure can be a wafer-based photovoltaic structure, or a thin film photovoltaic structure, which might have a size and shape different from those of regular wafers.

Some conventional solar panels include a single string of serially connected un-cleaved photovoltaic structures. As described in U.S. patent application Ser. No. 14/563,867, it can be more desirable to have multiple (such as 3) strings, each string including cascaded strips, and connect these strings in parallel. Such a multiple-parallel-string panel configuration provides the same output voltage with a reduced internal resistance. In general, a photovoltaic structure can be divided into n strips, and a panel can contain n strings, each string having the same number of strips as the number of regular photovoltaic structures in a conventional single-string panel. Such a configuration can ensure that each string outputs approximately the same voltage as a conventional panel. The n strings can then be connected in parallel to form a panel. As a result, the panel's voltage output can be the same as that of the conventional single-string panel, while the panel's total internal resistance can be 1/n of the resistance of a string (note that the total resistance of a string made of a number of strips can be a fraction of the total resistance of a string made of the same number of undivided photovoltaic structures). Therefore, in general, the greater n is, the lower the total internal resistance of the panel is, and the more power one can extract from the panel. However, a tradeoff is that as n increases, the number of connections required to inter-connect the strings also increases, which increases the amount of contact resistance. Also, the greater n is, the more strips a single photovoltaic structure needs to be divided into, which increases the associated production cost and decreases overall reliability due to the larger number of strips used in a single panel.

Another consideration in determining n is the contact resistance between the electrode and the photovoltaic structure on which the electrode is formed. The greater this contact resistance is, the greater n might need to be to reduce effectively the panel's overall internal resistance. Hence, for a particular type of electrode, different values of n might be needed to attain sufficient benefit in reduced total panel internal resistance to offset the increased production cost and reduced reliability. For example, conventional silver-paste or aluminum based electrode may require n to be greater than 4, because the process of screen printing and firing silver paste onto a photovoltaic structure does not produce ideal resistance between the electrode and the underlying photovoltaic structure.

In some embodiments of the present invention, the electrodes, including both the busbars and finger lines, can be fabricated using a combination of physical vapor deposition (PVD) and electroplating of copper as an electrode material. The resulting copper electrode can exhibit lower resistance than an aluminum or screen-printed-silver-paste electrode. Consequently, a smaller n can be used to attain the benefit of reduced panel internal resistance. In some embodiments, n is selected to be three, which is less than the n value generally needed for photovoltaic structures with silver-paste electrodes or other types of electrodes. Correspondingly, two grooves can be scribed on a single photovoltaic structure to allow it to be divided to three strips.

In addition to lower contact resistance, electro-plated copper electrodes can also offer better tolerance to micro cracks, which may occur during a cleaving process. Such micro cracks might adversely impact silver-paste-electrode photovoltaic structures. Plated-copper electrode, on the other hand, can preserve the conductivity across the surface of the photovoltaic structure even if there are micro cracks in the photovoltaic structure. The copper electrode's higher tolerance for micro cracks allows one to use thinner silicon wafers to manufacture the photovoltaic structures. As a result, the grooves to be scribed on a photovoltaic structure can be shallower than the grooves scribed on a thicker wafer, which in turn helps increase the throughput of the scribing process. More details on using copper plating to form low-resistance electrode on a photovoltaic structure are provided in U.S. patent application Ser. No. 13/220,532, filed Aug. 29, 2011, entitled "SOLAR CELL WITH ELECTROPLATED GRID," the disclosure of which is incorporated by reference in its entirety.

Figure 1C:
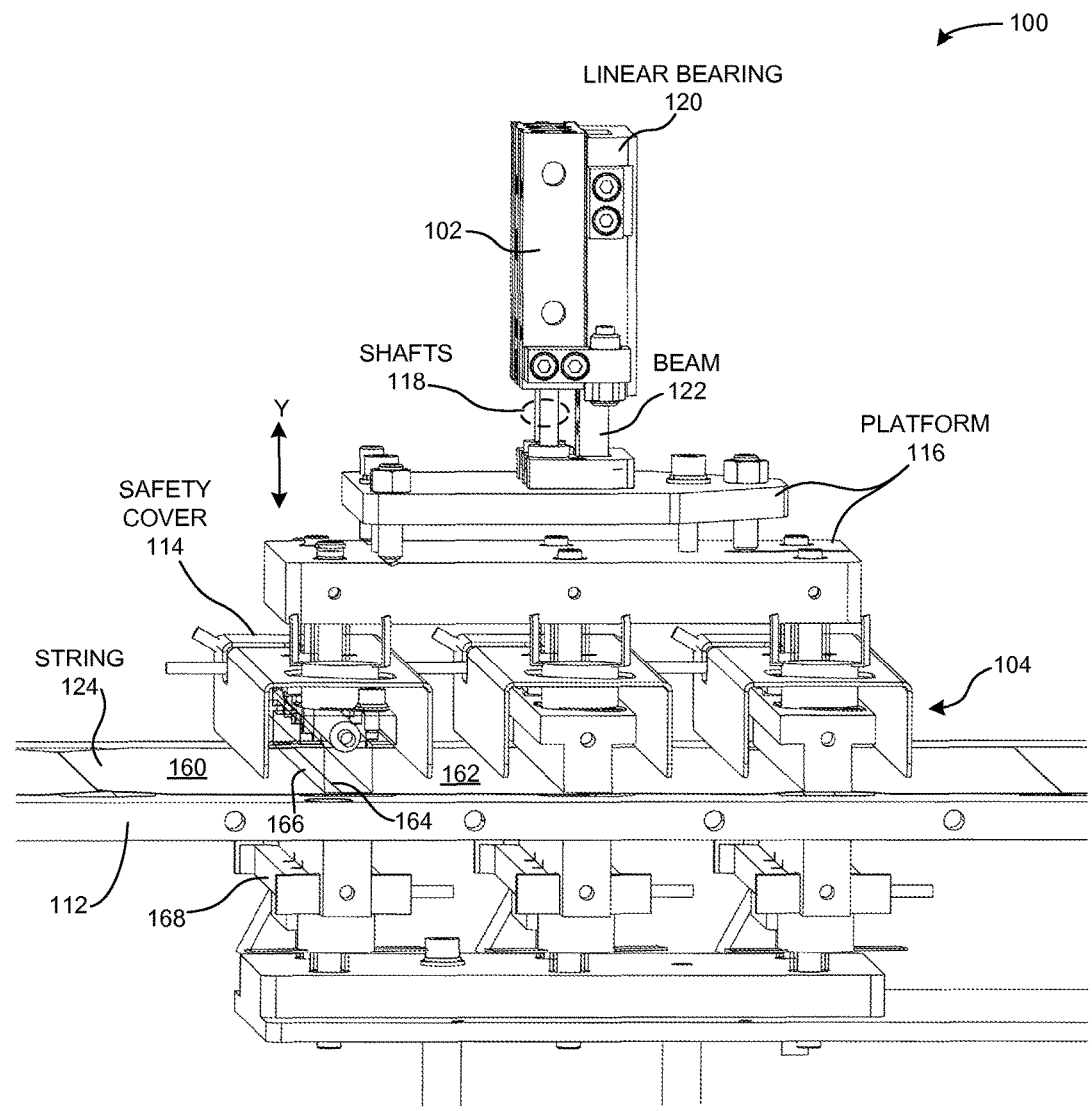
FIG. 1C shows a close-up view of the targeted-annealing system, according to one embodiment of the invention.

FIG. 1C shows a close-up view of targeted-annealing system 100, according to one embodiment of the invention. String 124 may be formed so that its paste regions are aligned with a set of openings on annealing platform 112. For example, string 124 can include strips 160 and 162 that overlap along a paste region 164. Annealing platform 112 can shift string 124 so that paste region 164 (and the corresponding opening on anneal platform 112) may be aligned with heat-treating bars 166 and 168. Heat-treating bars 166 and 168 may apply sufficient heat to paste region 164 for at least a time duration that may cure the conductive paste. In some embodiments, heat-treating bars 104 can be at least partially surrounded by safety covers (e.g., safety cover 114), which may prevent a human operator from accidentally touching a heat-treating bar while it is heated to the target curing temperature.

Heat-treating bars 104 can be mounted on platform 116, and actuator 102 can move, such as lower or raise, platform 102 to move heat-treating bars toward or away from string 124. Actuator 102 can include a hydraulic, a pneumatic, or a motorized actuator (or any combination thereof) that may extend or contract one or more shafts 118 that may be coupled to platform 116. For example, a hydraulic or a pneumatic actuator can include a valve for each internal piston that may extend or contract a corresponding shaft, such as by increasing a gas or liquid pressure inside the piston compartment.

Moreover, linear bearing 120 can stabilize a linear movement of heat-treating bars 104. For example, linear bearing 120 can be coupled to actuator 102, and may include beam 122 coupled to platform 116. Linear bearing 120 and/or beam 122 may include a set of ball bearings that can reduce a friction between linear bearing 120 and beam 122, while linear bearing 120 may guide beam 122 in a linear movement. Actuator 102 can extend or retract shafts 118 to move heat-treating bars 104 toward or away from string 124, and beam 122 can slide along a rail of linear bearing 120 along a Y axis to ensure that heat-treating bars 104 also move in a linear direction along the Y axis.

Figure 2A:
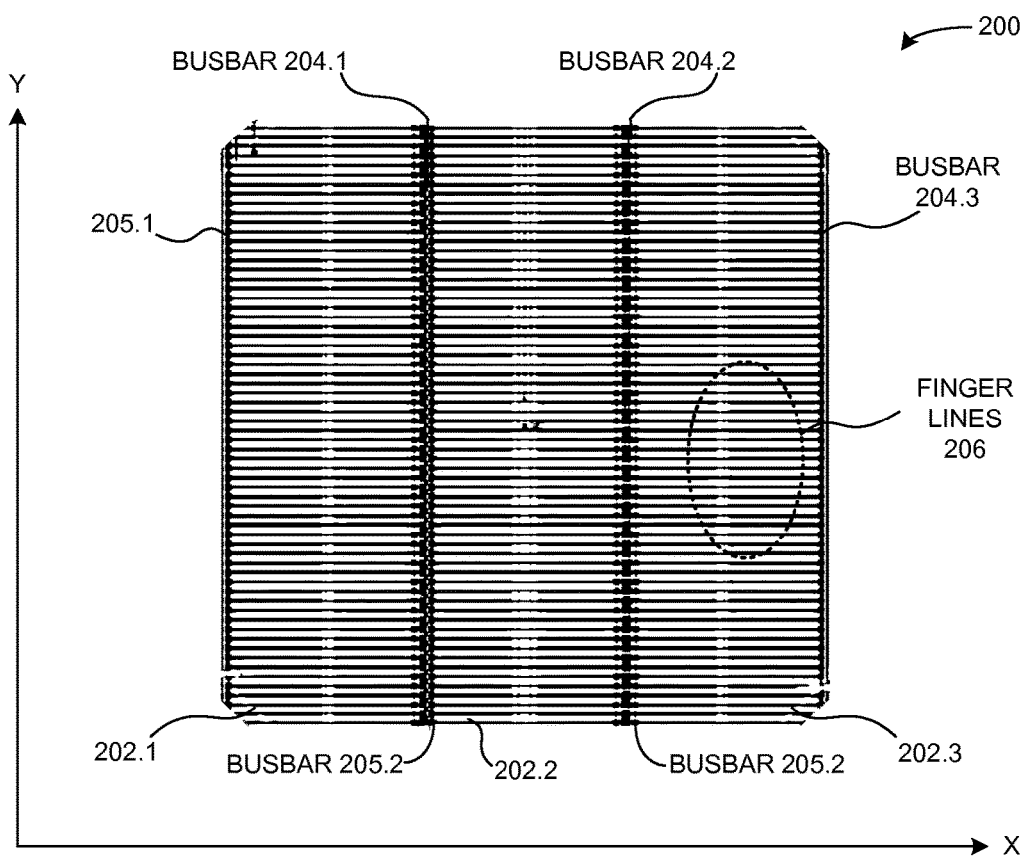
FIG. 2A shows a photovoltaic structure, according to one embodiment of the invention.

FIG. 2A shows photovoltaic structure 200, according to one embodiment of the invention. Photovoltaic structure 200 can include three photovoltaic strips 202.1, 202.2, and 202.3, which can be the result of photovoltaic structure 200 having an electroplated copper electrode that exhibits low contact resistance. Each strip can include a number of substantially parallel finger lines, such as finger lines 206, arranged in the X direction. These finger lines can collect the carriers generated by the photovoltaic structure and allow them to move toward a busbar. The busbar can be any electrically conductive element such as a metallic strip, often wider than a finger line, arranged in the Y direction. The busbar then can aggregate the current collected by the finger lines. Each strip can include two busbars, one on each surface, positioned on opposite edges. For example, strip 202.1 can have busbar 204.1 on the top surface, and busbar 205.1 on the bottom surface. Similarly, strip 202.2 can have busbars 204.2 and 205.2 on the top and bottom surfaces, respectively, and strip 202.3 can have busbars 204.3 and 205.3 on the top and bottom surfaces, respectively. In one embodiment, photovoltaic structure 200 can be scribed near and along busbars 204.1 and 204.2, which allows photovoltaic structure 200 to be subsequently cleaved into three strips along these grooves. Additional busbars may be added to either surface to reduce resistance.

Figure 2B:
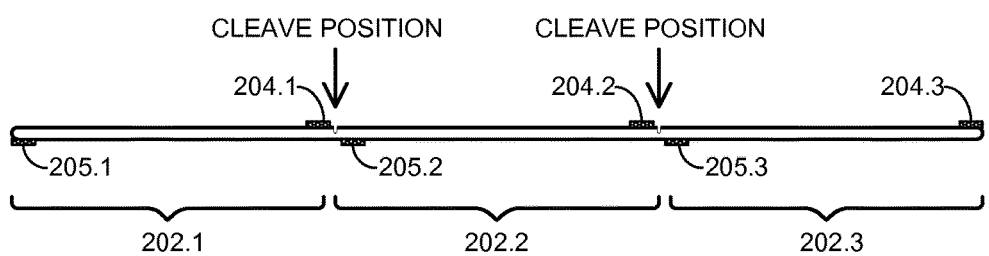
FIG. 2B shows a cross-sectional view of the photovoltaic structure prior to being cleaved, according to one embodiment of the invention.

FIG. 2B shows a cross-sectional view of photovoltaic structure 200 prior to being cleaved, according to one embodiment of the invention. Two scribed grooves can be located between busbars 204.1 and 205.2, and between busbars 204.2 and 205.3, respectively. These grooves correspond to the cleave positions. After the subsequent cleaving process, the entire photovoltaic structure can be divided, for example, to three strips 202.1, 202.2, and 202.3.

Figure 2C:
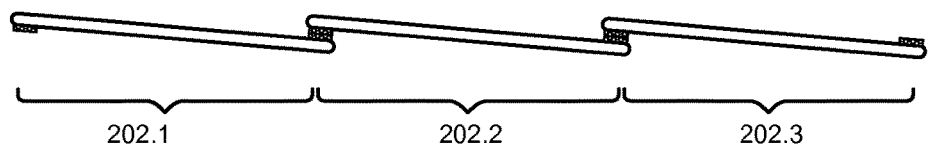
FIG. 2C shows a cascaded arrangement of three strips after a photovoltaic structure is cleaved, according to one embodiment of the invention.

FIG. 2C shows a cascaded arrangement of three strips after a photovoltaic structure is cleaved, according to one embodiment of the invention. In this example, three strips 202.1, 202.2, and 202.3 can be arranged in a cascaded manner, such that the positive-side busbar of one strip overlaps and is electrically coupled to the negative-side busbar of the neighboring strip. A conductive paste can be applied between two facing busbars to facilitate both low-resistance contact and physical bonding. Because no conductive tabs or wires are used, such a cascading arrangement can reduce the series resistance due to inter-connection between to strips, and can improve the fill-factor of the panel.

Figure 2D:
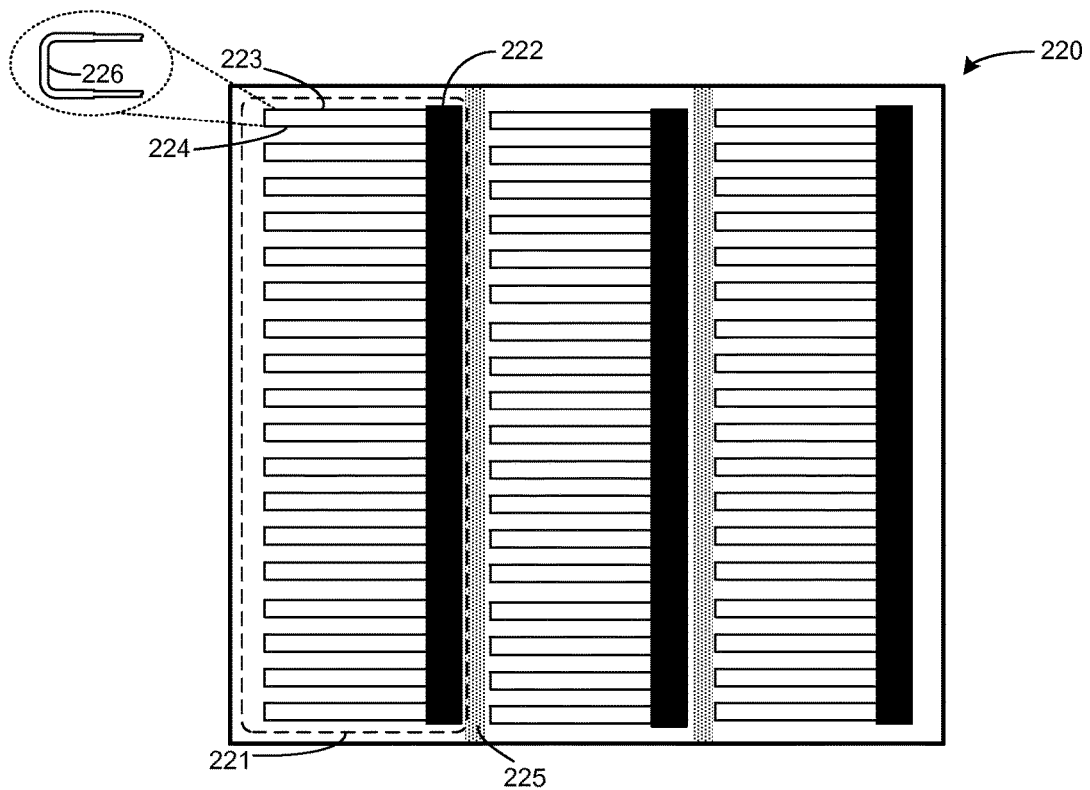
FIG. 2D shows an exemplary conductive grid and blank space pattern on the front surface of a photovoltaic structure, according to one embodiment of the invention.

FIG. 2D shows an exemplary conductive grid and blank space pattern on the front surface of a photovoltaic structure, according to one embodiment of the invention. In the example shown in FIG. 2D, conductive grid 220 can be made of any electrically conductive material, including metallic and non-metallic materials. Conductive grid 220 can include three sub-grids, such as sub-grid 221. The photovoltaic structure can also include a blank space (i.e., space not covered by electrodes) between neighboring sub-grids, such as blank space 225. The blank space provides the area where scribing and cleaving can occur. Because the blank space is not covered with any conductive material, the scribing and cleaving can occur without contacting the electrode. Each sub-grid can function as the front-side grid for the corresponding strip. Hence, this sub-grid-and-blank-space configuration can allow the photovoltaic structure to be divided into three strips. In general, a respective sub-grid can have various types of patterns. For example, a sub-grid can have two, instead of one, busbars, or a single busbar placed in the center of the strip. In the example shown in FIG. 2D, the sub-grids can each have a single busbar pattern placed on the edge, which allows the strips to be cascaded.

Figure 2E:
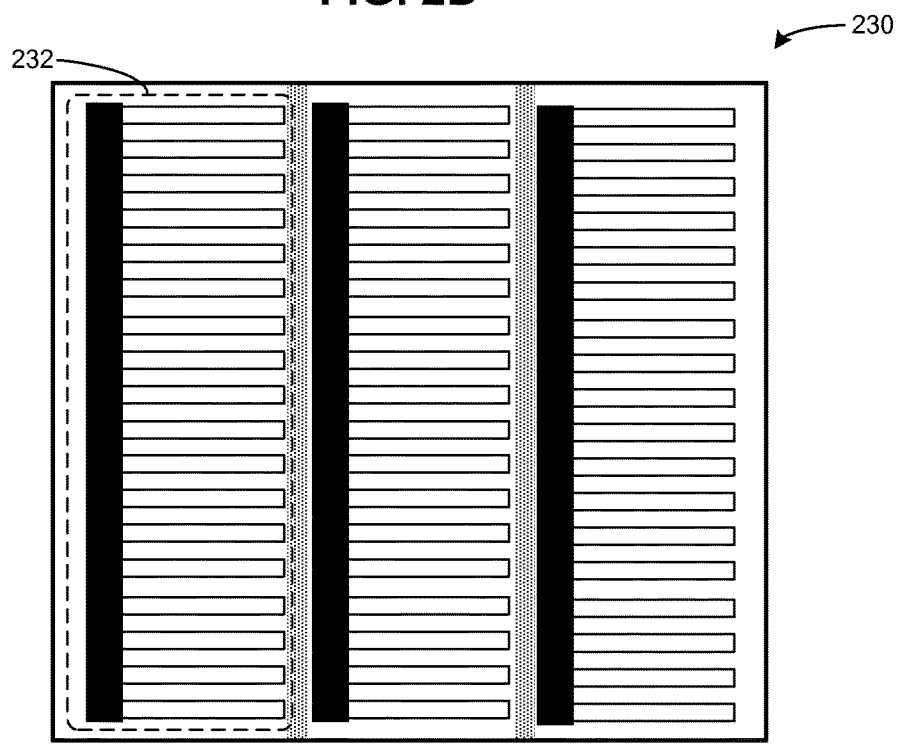
FIG. 2E shows an exemplary conductive grid and blank space pattern on the back surface of a photovoltaic structure, according to one embodiment of the invention.

FIG. 2E shows an exemplary conductive grid and blank space pattern on the back surface of a photovoltaic structure, according to one embodiment of the invention. In this example, back conductive grid 230 can include three sub-grids. In one embodiment, the back side sub-grids may correspond to the front side sub-grids. As a result, the back side of the strips can also absorb light to generate electrical energy, thereby allowing the solar panel to operate in a bifacial manner. In the embodiment shown in FIGS. 2D and 2E, the front and back side sub-grids can have similar patterns except that the front and back edge-busbars are located near opposite edges of the strip. In other words, the busbar on the front side of the strip may be located near one edge, and the busbar on the back side may be located near the opposite edge. In addition, the locations of the blank spaces on the back side may be aligned with the locations of the blank spaces on the front side, such that the conductive grid lines may not interfere with the subsequent cleaving process.

In the embodiment shown in FIGS. 2D and 2E, each sub-grid may include an edge-busbar running along the longer edge of the corresponding strip and a plurality of parallel finger lines running in a direction substantially parallel to the shorter edge of the strip. For example, in FIG. 2D, sub-grid 221 may include edge-busbar 222, and a number of finger lines, such as finger lines 223 and 224. A blank space, which is not covered by any conductive material, can be placed between two adjacent sub-grids to facilitate the subsequent scribe and cleaving process. Note that in FIG. 2D the ends of the finger lines can be connected by a conductive line to form "loops." This type of "looped" finger line pattern can reduce the likelihood of the finger lines from peeling away from the photovoltaic structure after a long period of usage. For example, as shown in FIG. 2D, finger lines 223 and 224 are connected by conductive line 226 to form a loop with rounded corners. Optionally, the sections where the finger lines are joined can be wider than the rest of the finger lines to provide more durability and prevent peeling. Other finger line patterns, such as un-looped straight lines or loops with different shapes, are also possible.

As shown in FIG. 2D, strip-shaped blank space 225, shown in a shaded rectangle, can separate sub-grid 221 from its adjacent sub-grid. The width of the blank space, such as blank space 225, is chosen to provide sufficient area for the scribing process (e.g., using a laser scribe system) without causing significant damage to the nearby electrodes, and yet sufficiently narrow so that the electrodes can reach the edge of each strip and provide low-resistance collection of the carriers. There may be a tradeoff between a wider blank space that facilitates more error-tolerant scribing operation and a narrower blank space that results in more effective current collection. In one embodiment, the blank space width can be between 0.5 mm and 2 mm. In a further embodiment, the width of such a blank space may be 1 mm.

Figure 2F:
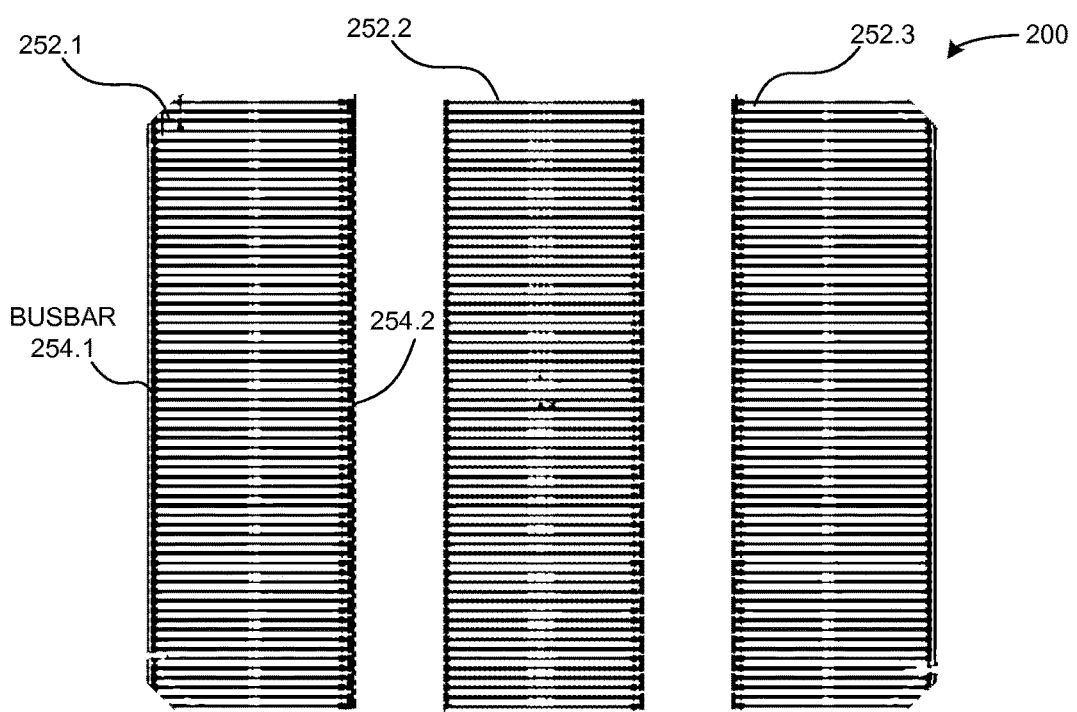
FIG. 2F shows multiple strips, which are the result of separating a photovoltaic structure along a set of grooves, according to one embodiment of the invention.

As mentioned above, in order to prevent causing significant damage to the emitter junction of the photovoltaic structure, the scribing operation may be performed on the surface corresponding to the surface field layer. For example, if the emitter junction is on the front side of the photovoltaic structure, the scribing may occur to the back surface of the photovoltaic structure. On the other hand, if the emitter junction is on the back side, the scribing may occur on the front surface of the photovoltaic structure. FIG. 2F shows multiple strips 252.1, 252.2, and 252.3, which are the result of separating a photovoltaic structure along a set of grooves, according to one embodiment of the invention. Each strip can include two busbars, one on each side, on opposite edges. For example, strip 252.1 can include separate busbars 254.1 and 254.2 on the front side and back side, respectively.

Stringy-Forming System

Figure 3:
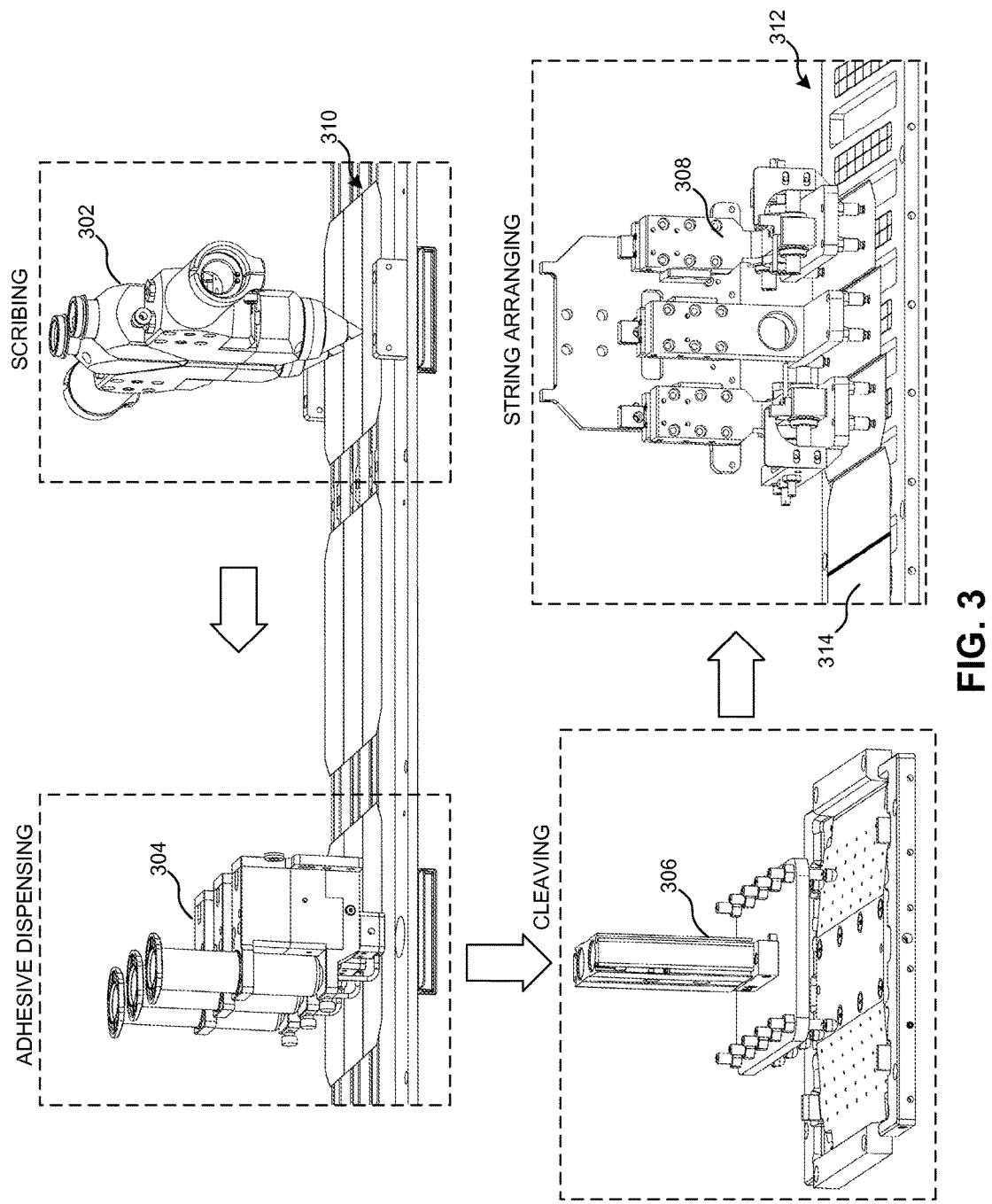
FIG. 3 shows a sequence of steps for processing photovoltaic structures to produce a string, according to one embodiment of the invention.

FIG. 3 shows a sequence of steps for processing photovoltaic structures to produce a string, according to one embodiment of the invention. In this example, conveyor 310 can move photovoltaic structures to scribing system 302, which can scribe one or more grooves along the busbars of each photovoltaic structure. Conveyor 310 can then move the photovoltaic structures to adhesive-dispensing system 304, which can dispense a conductive adhesive paste on busbars of the strips, so that after cleaving these strips can be bonded together in a cascaded arrangement.

After application of the conductive adhesive paste, the photovoltaic structures can be picked up from conveyor 310 by, for example, a robotic arm (not shown) via a suction device that may be integrated into the robotic arm. The robotic arm can hold the photovoltaic structure by maintaining the suction force while moving the photovoltaic structure toward cleaving system 306. The robotic arm can rotate photovoltaic structures approximately 90 degrees before placing it onto a loading system of cleaving system 306. The loading system may also include a buffer where the photovoltaic structures can be stored before being moved to cleaving system 306.

Cleaving system 306 can receive photovoltaic structures from the loading system, and can divide the photovoltaic structures into strips along the grooves formed by scribing tool 302. After a photovoltaic structure is divided into a number of (e.g., three) strips, string-arrangement system 308 can lift these strips and arrange the strips in a cascaded arrangement while moving the strips to annealing platform 312. String-arrangement system 308 can overlap a leading edge of the three cascaded strips over the trailing edge of string 314, thereby extending string 314.

The sequence of operations shown in FIG. 3 is one of many ways to manufacture cascaded strings. For example, the step of applying the conductive adhesive paste can occur before scribing or after cleaving. Furthermore, a variety of apparatuses and systems can be used to implement the functions showing in FIG. 3.

String-Generating Lanes

Figure 4:
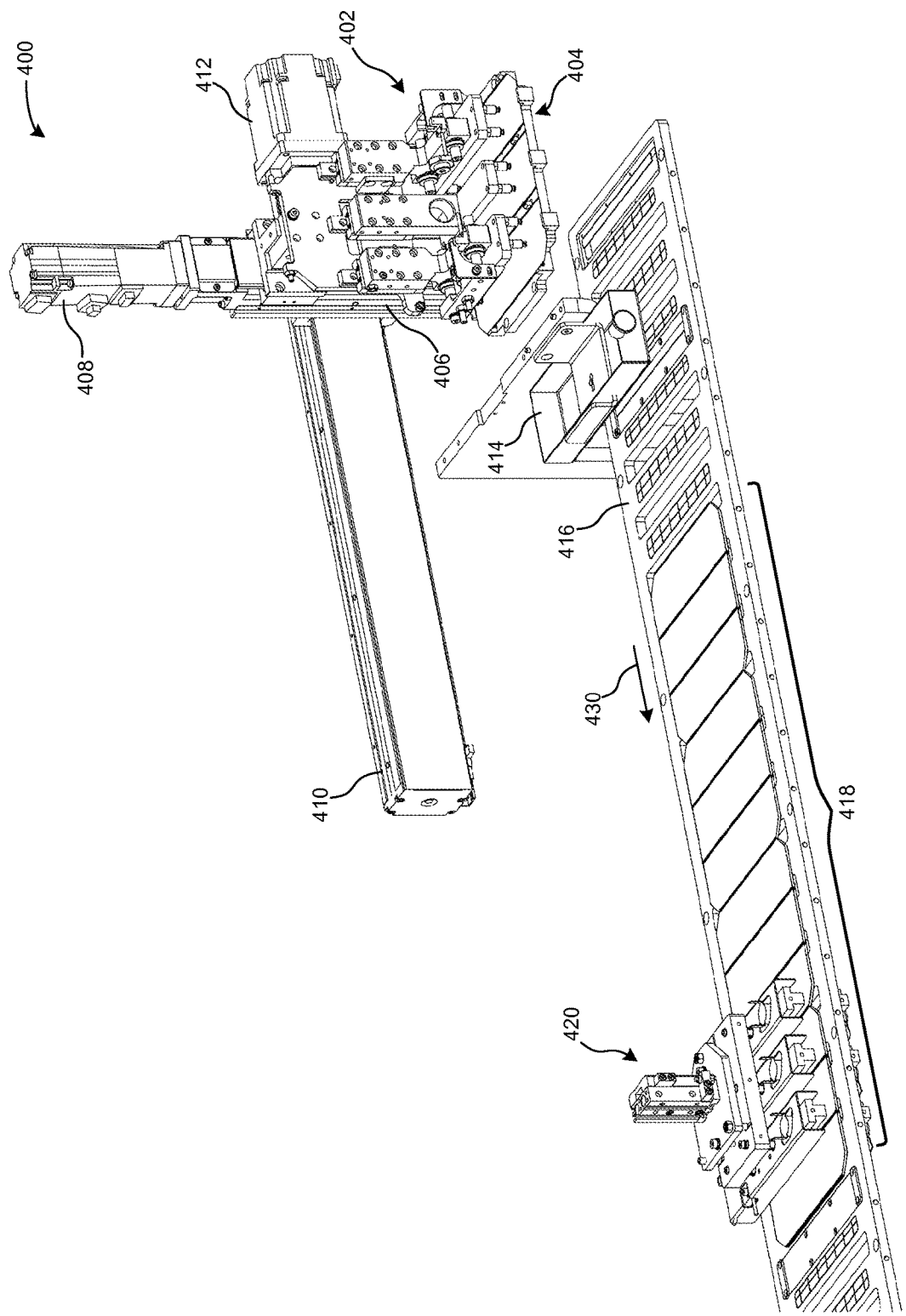
FIG. 4 shows a string-generating lane, according to one embodiment of the invention.

FIG. 4 shows string-generating lane 400, according to one embodiment of the invention. String-generating lane 400 can include a string-forming system 402 that can form string 418 on annealing platform 416 using strips from holding tray 404. In some embodiments, holding tray 404 can be mounted on a cleaving table that may cleave a photovoltaic structure into multiple strips, and can test various electrical properties of the strips. For example, a probe tester (not shown) may have three testing units, where each testing unit can have multiple probes. During the testing operation, the probes can be lowered to establish an electrical contact with the surface of the strips, where a respective probe can apply a voltage to a busbar on the strip, and the same probe or another probe can measure the current. A defective strip can then be identified based on the probes' measurements. A strip may be considered defective if a measured current through the strip is less than a predetermined level of current.

If any of the strips fail, string-forming system 402 can pick up the strips from output tray 404 using a set of suction nozzles for each strip, and deposits the defective strip (or all strips of the photovoltaic structure) into disposal bin 414. On the other hand, if the strips are not defective, actuator 412 can move string-forming system 402 along rail 410 toward annealing platform 416, and string-forming system 402 can lift, shift and align the strips to form a cascaded strip assembly. Actuator 408 can then conform string-forming system 402 to annealing platform 416, which can have the effect of moving (e.g., lowering) the cascaded strips toward annealing platform 416. In some embodiments, string-forming system 402 can overlap a portion of the cascaded strips with a trailing end of string 418 to extend string 418. Also, annealing platform 416 may include a series of openings, and string-forming system 412 may generate string 418 so that the overlapping segments of the cascaded strips are resting above the openings.

In one embodiment, targeted-annealing system 420 can anneal the conductive paste between overlapping strips of string 418 over a series of annealing steps. Prior to each annealing step, annealing platform 416 can shift string 418 in direction 430 to align the openings of annealing platform 416 (and the overlapped areas of string 418) to the heat-treating bars of targeted-annealing system 420. Shifting string 418 can expose additional space on annealing platform 416 for string-forming system 412 to deposit additional cascaded strip assemblies. After the alignment is complete, the heat-tearing bars can establish contact with string 418 to cure the conductive paste that can bind the strips along their busbars. The heat-treating bars of targeted-annealing system 420 can be positioned such that they may approach string 418 from above and below annealing platform 416, and may apply heat to both sides of string 418 around the area where two strips overlap. The series of openings on annealing platform 416 may allow the bottom-side heat-treating bars to contact string 418 from under the surface.

In another embodiment, targeted-annealing system 420 may anneal the conductive paste throughout string 418 in one step. Targeted-annealing system 420 may have additional heat-treating bars such that one set of heat-treating bars is dedicated to each overlapped area of string 418.

Figure 5:
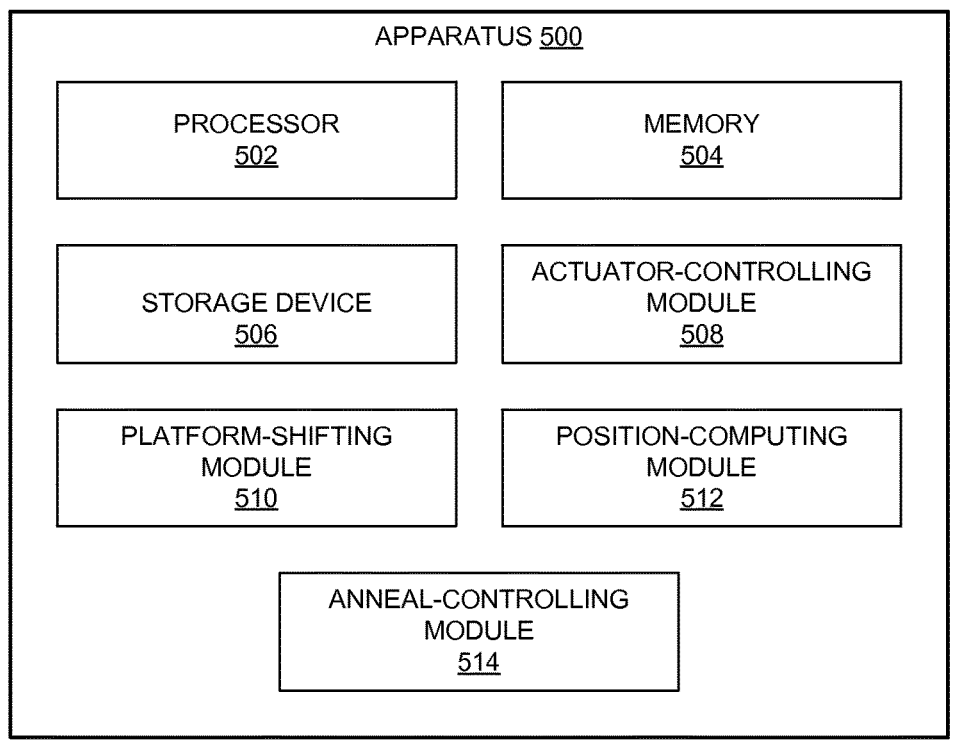
FIG. 5 shows an exemplary control apparatus, according to one embodiment of the invention.

FIG. 5 shows exemplary control apparatus 500, according to one embodiment of the invention. Apparatus 500 can include a plurality of modules which may communicate with one another via a wired or wireless communication channel. Apparatus 500 may be realized using one or more integrated circuits, and may include fewer or more modules than those shown in FIG. 5. Further, apparatus 500 may be integrated in a computer system, or realized as a separate mechanism which may be capable of communicating with other computer systems and/or mechanisms.

Control apparatus 500 can include processor 502, memory 504, and storage device 506. Memory 504 can include a volatile memory (e.g., RAM) that serves as a managed memory, and can be used to store one or more memory pools. In some embodiments, storage device 506 can store an operating system, and instructions for monitoring and controlling the string-generating process.

Apparatus 500 can also include actuator-controlling module 508, platform-shifting module 510, position-computing module 512, and anneal-controlling module 514. Actuator-controlling module 508 can activate a set of actuators of a targeted-annealing system to conform a set of heat-treating bars to a predetermined elevation, such as to lower or raise a set of heat-treating bars toward or away from a string on an annealing platform. Platform-shifting module 510 can activate a set of actuators that can cause the annealing platform to align the overlapping strip segments of a string prior to each annealing step, and to move the string toward a lay-up station after the annealing process. The layup table can combine multiple strings to form a solar panel.

Position-computing module 512 can periodically re-compute an updated position of the cascaded string on the annealing platform, while the annealing platform moves the string toward the targeted-annealing system or toward the lay-up station. For example, position-computing module 512 can determine the position of the annealing platform and a timestamp for each position by reading a set of sensors (e.g., proximity sensors) lined along a platform base. Each sensor can correspond to a different absolute position of the platform base with respect to the platform base, and position-computing module 512 can compute an updated position of the annealing platform between sensors based on a timestamp, speed, and direction in which the annealing platform is moving. Position-computing module 512 can determine the position of the platform openings along the annealing platform based on the platform's relative position to the platform base. Also, position-computing module 512 can calculate the position of a strip on the annealing platform based on the position of two platform openings that are aligned with the strip's busbars Anneal-controlling module 516 can conform a set of heat-treating bars with the overlapping strip segments to anneal the conductive paste through a sequence of one or more annealing steps as the annealing platform shifts the string toward the lay-up station.

Figure 6:
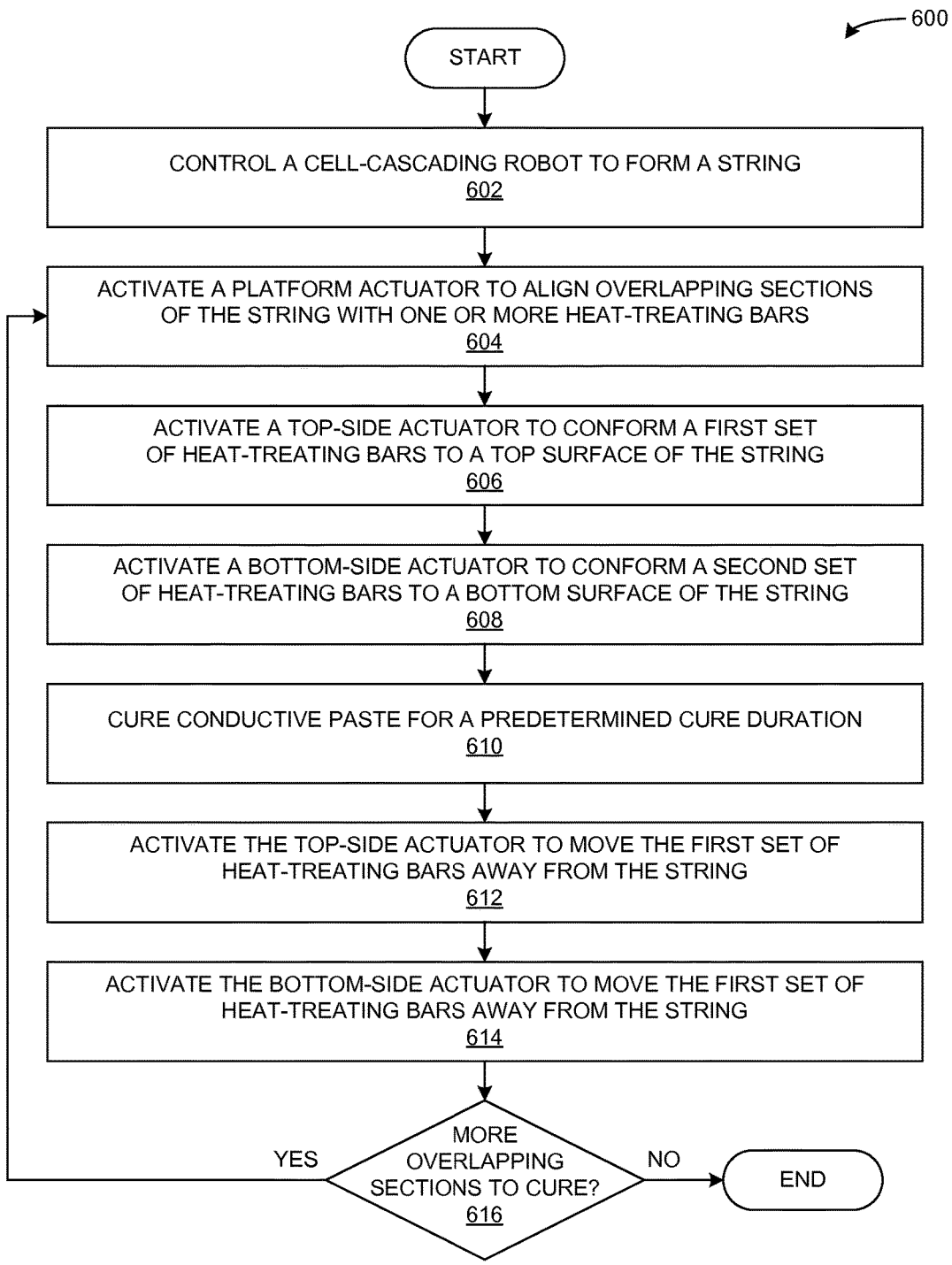
FIG. 6 presents a flow chart showing method for curing a conductive paste between overlapping strips, according to one embodiment of the invention.

FIG. 6 presents a flow chart showing method 600 for curing a conductive paste between overlapping strips, according to one embodiment of the invention. During operation, a controller can control a cascading robot to form a string of cascaded strips (operation 602). The controller can then move the string to a targeted-annealing station by activating a platform actuator to align overlapping strip segments with one or more heat-treating bars (operation 604). Once the string's overlapping sections become aligned with the heat-treating bars, the controller can activate a top-side actuator that can conform a first set of heat-treating bars to a top surface of the string (operation 606), such as by lowering the first set of heat-treating bars. The controller can also activate a bottom-side actuator that can conform (e.g., by raising) a second set of heat-treating bars to a bottom surface of the string (operation 608).

The controller may then cure the conductive paste for a predetermined cure duration (operation 610). In some embodiments, the controller may regulate a current or power level to an electric heat source within a respective heat-treating bar to maintain a target curing temperature on a surface of the respective heat-treating bar. In some embodiments, the target curing temperature can be 160 degrees Celsius. Moreover, the controller may regulate a fan speed of a fan mounted on the heat-treating bar to prevent the surface of the heat-treating bar from rising above an upper threshold.

After curing the conductive paste, the controller may activate the top-side actuator to move the first set of heat-treating bars away from the top string surface(operation 612), and may activate the bottom-side actuator to move the second set of heat-treating bars away from the bottom string surface(operation 614). For example, the top-side actuator can move the first set of heat-treating bars to a standby position above the annealing platform, and the bottom-side actuator can move the second set of heat-treating bars to a standby position below the annealing platform. The controller may then determine whether more overlapping sections of the string may still need to be cured (operation 616). If so, the controller can return to operation 604, which may align other remaining overlapping sections of the string with the set of heat-treating bars. Otherwise, the process may end.

Figure 7A:
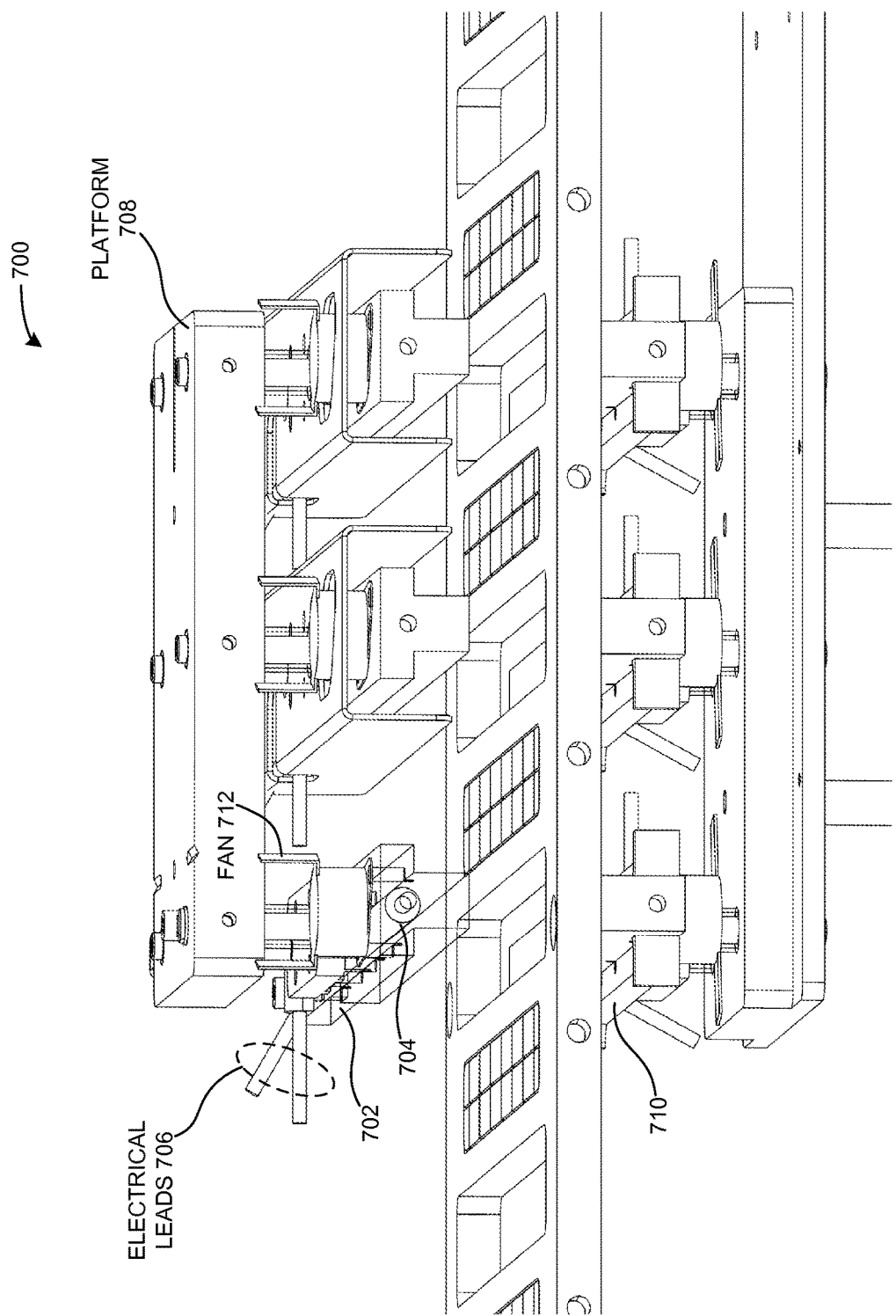
FIG. 7A shows a top segment of the targeted-annealing system, according to one embodiment of the invention.

FIG. 7A shows a top segment of targeted-annealing system 700, according to one embodiment of the invention. Targeted-annealing system 700 can regulate a temperature of a heat-treating bar 702 by controlling an amount of heat generated by heat-treating bar 702, and/or by controlling an airflow that can move heat away from heat-treating bar 702. This precise temperature regulation can prevent applying too much heat to a photovoltaic structure, which can damage the electrical properties of the strips, or can cause the strips to fracture. For example, heat-treating bar 702 can include electrical heat source 704 whose temperature can be controlled by adjusting a current and/or voltage across a set of electrical leads 706. Heat source 704 can include an elongated shape, whose longest side may be parallel to a paste region of two overlapping strips when heat-treating bar 702 is lowered toward the strips. In some embodiments, the elongated shape can include a circular cross-section to form a cylinder. However, the elongated shape can include a cross-section of any other curved or polygon shape, such as an oval shape, a triangle, a quadrilateral (e.g., a square), etc.

Heat-treating bar 702 can also include fan 712 that may prevent heat source 704 from overheating. In some embodiments, targeted-annealing system 700 can regulate the temperature along a bottom surface of heat source 704. For example, the temperature for heat-treating bars may need to fall within a target temperature range with a lower threshold and an upper threshold. If the temperature drops below the lower temperature threshold, targeted-annealing system 700 may increase the current and/or voltage across electrical leads 706 and/or may decrease the fan speed of fan 712. On the other hand, if the temperature rises above the upper temperature threshold, targeted-annealing system 700 may decrease the current and/or voltage across electrical leads 736 and/or may increase the fan speed of fan 712.

Figure 7B:
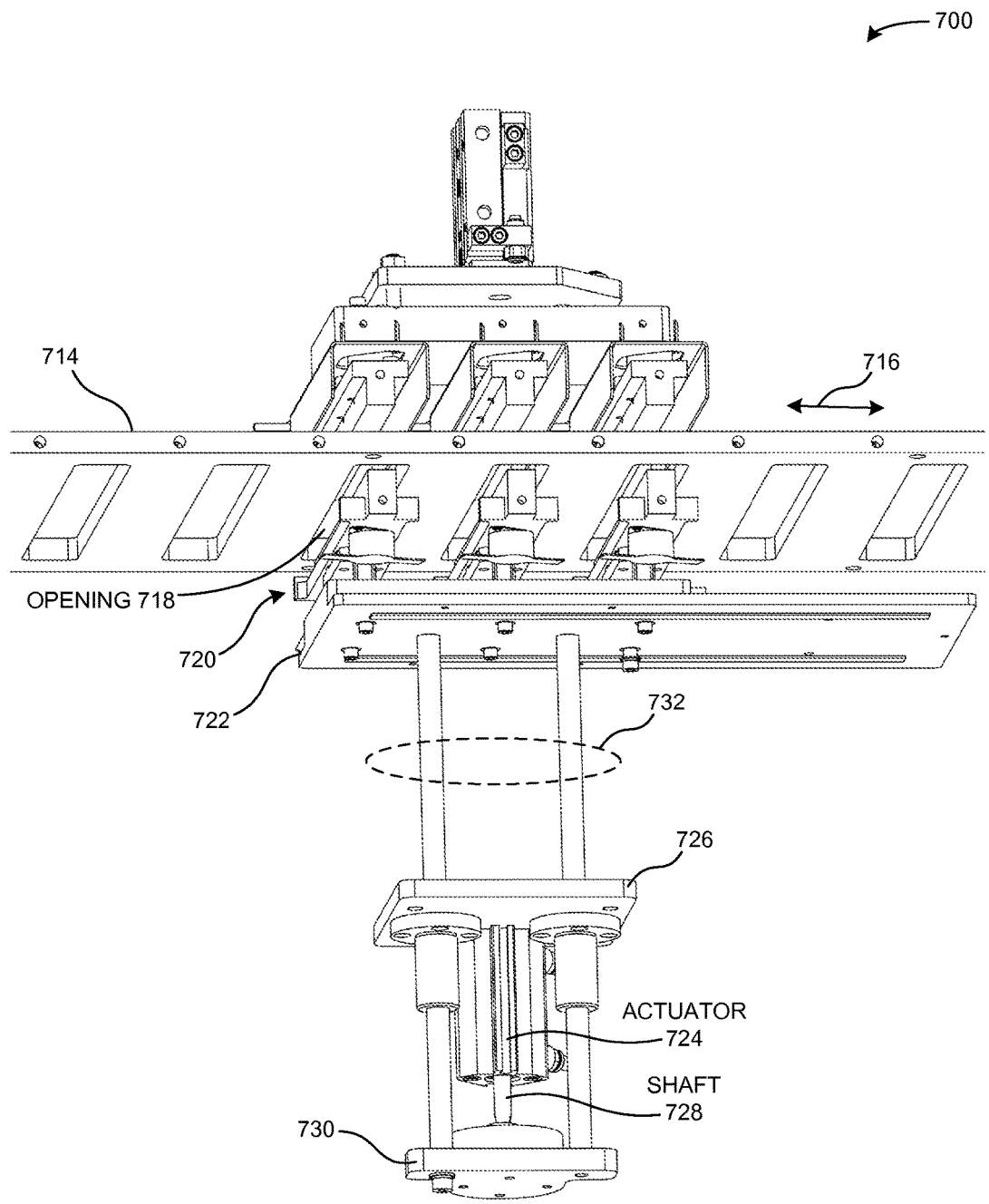
FIG. 7B shows a bottom segment of the targeted-annealing system, according to one embodiment of the invention.

FIG. 7B shows a bottom segment of targeted-annealing system 700, according to one embodiment of the invention. The bottom segment can include platform 722, on top of which one or more heat-treating bars may be mounted. Recall that the paste regions of a string may be aligned with a set of openings on annealing platform 714 Annealing platform 714 may be shifted along direction 716 so that a set of openings (e.g., opening 718) become aligned with the heat-treating bars (e.g., heat-treating bar 720), at which point targeted-annealing system 700 may activate actuator 724 to raise platform 722 to a predetermined height. Raising platform 722 to this predetermined height may cause the set of heat-treating bars to pass through the set of openings on annealing platform 714 until the heat-treating bars may become sufficiently close to heat a bottom surface of the string's paste regions. In some embodiments, the heat-treating bars may make contact with the bottom surface of the string's paste regions.

Actuator 724 can be mounted on plate 726, and can include a hydraulic, a pneumatic, or a motorized actuator (or any combination thereof) that may extend or retract at least one shaft 728 that may be coupled to bottom platform 730. In some embodiments, plate 726 can be coupled to a fixed surface, such as a supporting frame for annealing table 714. Hence, by retracting shaft 728, actuator 724 may raise plate 730, which in turn raises rods 732, platform 722, and the set of heat-treating bars on platform 722. Similarly, actuator 724 may extend shaft 728, which in turn may lower plate 730, along with rods 732, platform 722, and the set of heat-treating bars on platform 722.

In some embodiments, targeted-annealing system 700 can raise the bottom-side heat-treating bars to make contact with multiple paste regions of a string by causing actuator 724 to lift platform 722. Once the heat-treating bars have made contact for a sufficient amount of time (e.g., for a predetermined curing duration), targeted-annealing system 700 can stop annealing the paste regions by causing actuator 724 to lower platform 722.

Figure 7C:
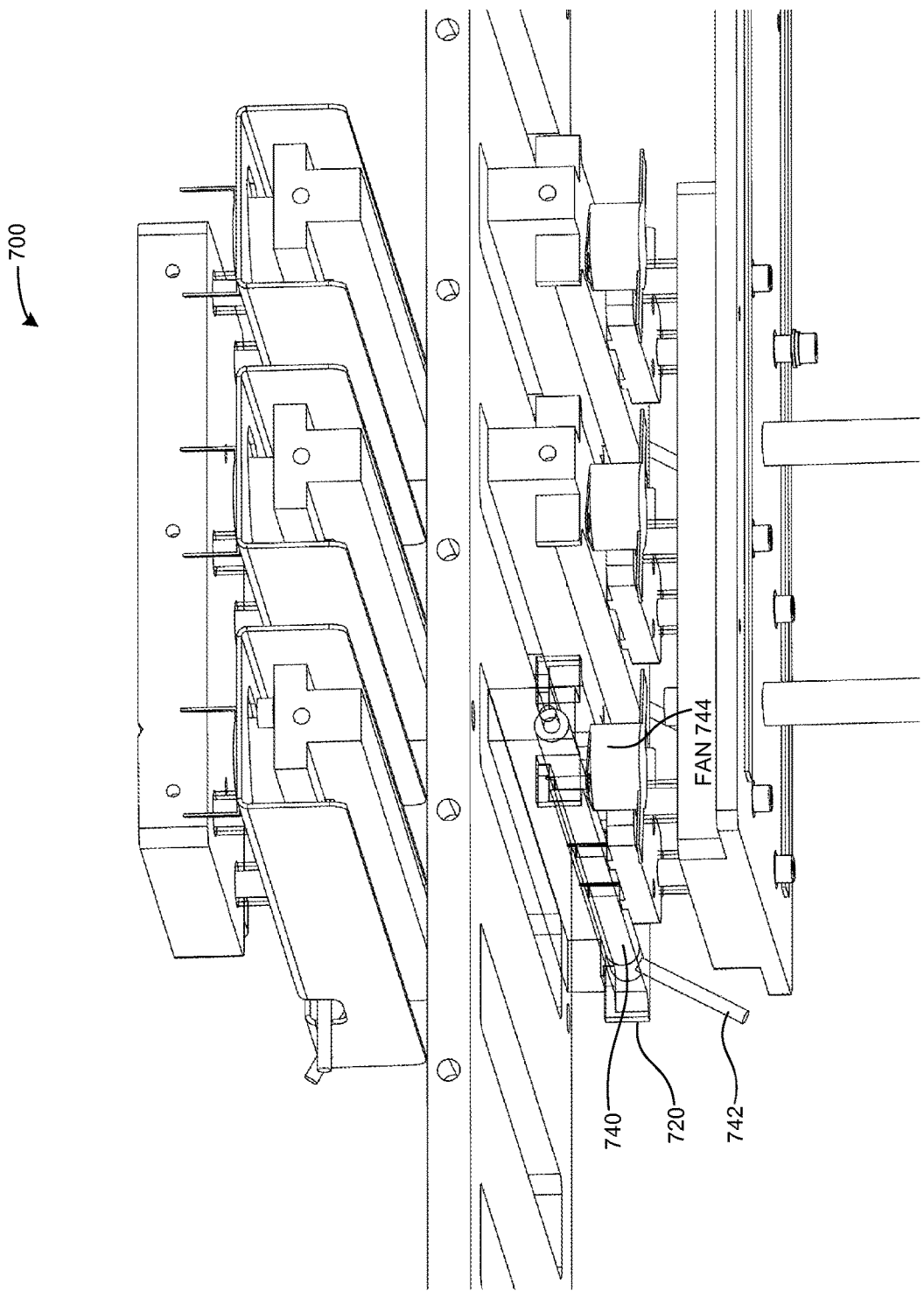
FIG. 7C shows a close-up view of a set of bottom-side heat-treating bars, according to one embodiment of the invention.

FIG. 7C shows a close-up view of a set of bottom-side heat-treating bars, according to one embodiment of the invention. Heat-treating bar 720 can include electrical heat source 740 that can generate heat within heat-treating bar 720, and can include fan 744 that may keep heat-treating bar 720 from heating up above a maximum threshold temperature. Targeted-annealing system 700 can control the temperature of heat-treating bar 720 by adjusting a current and/or voltage across a set of electrical leads 742, and/or by adjusting a fan speed of fan 744.

Figure 7D:
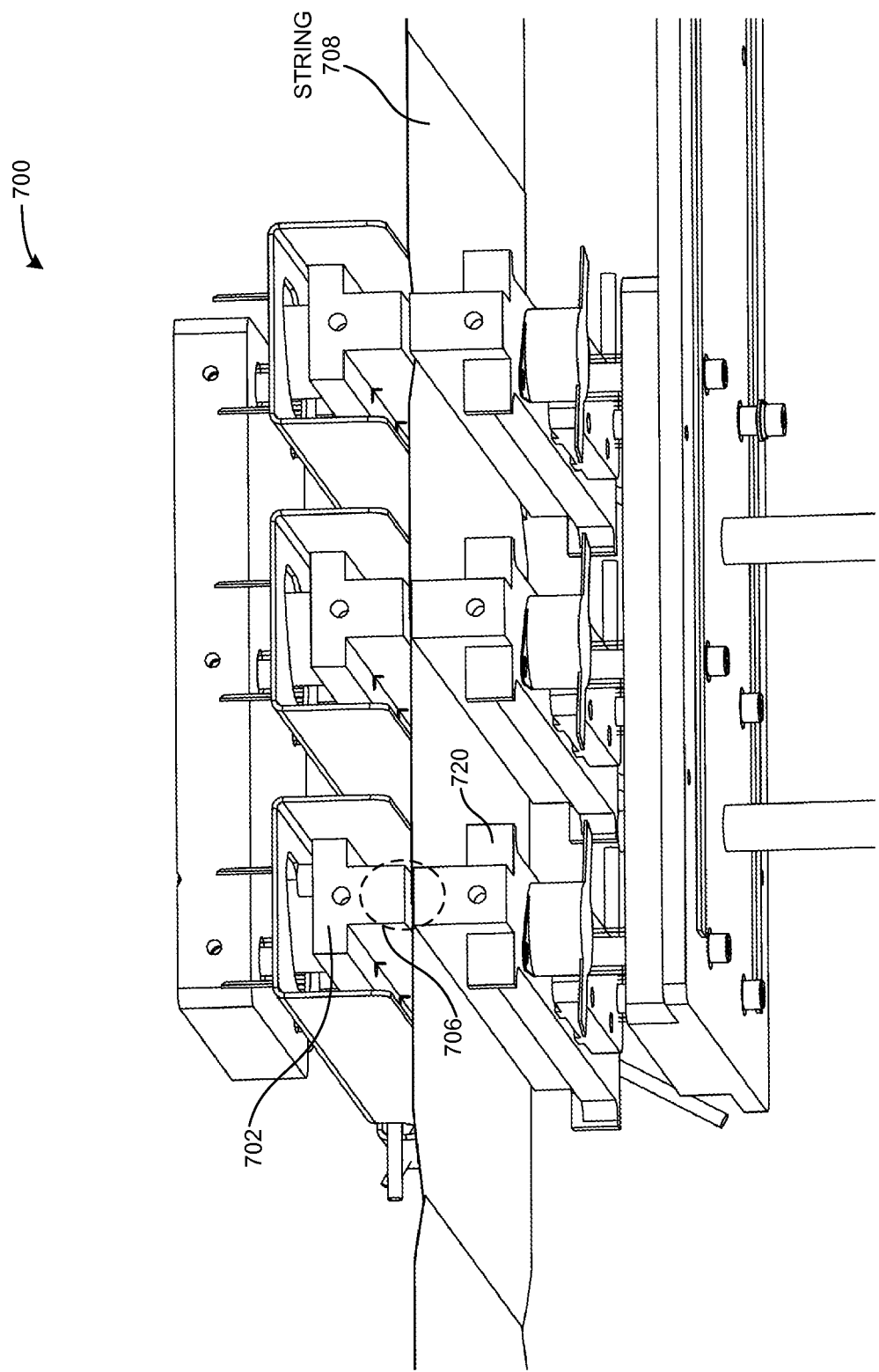
FIG. 7D shows a set of heat-treating bars that may make contact with paste regions of a string, according to one embodiment of the invention.

FIG. 7D shows a set of heat-treating bars that may make contact with paste regions of string 708, according to one embodiment of the invention. Heat-treating bar 702 can make contact with a top surface of paste region 706, and heat-treating bar 720 can pass through an opening of an annealing platform (not shown) to make contact with a bottom surface of paste region 706.

The data structures and code described in this detailed description can typically be stored on a computer-readable storage medium, which may be any device or medium that can store code and/or data for use by a computer system. The computer-readable storage medium can include, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

The methods and processes described in the detailed description section can be embodied as code and/or data, which can be stored in a computer-readable storage medium as described above. When a computer system reads and executes the code and/or data stored on the computer-readable storage medium, the computer system can perform the methods and processes embodied as data structures and code and stored within the computer-readable storage medium.

Furthermore, the methods and processes described above can be included in hardware modules. For example, the hardware modules can include, but are not limited to, application-specific integrated circuit (ASIC) chips, field-programmable gate arrays (FPGAs), and other programmable-logic devices now known or later developed. When the hardware modules are activated, the hardware modules can perform the methods and processes included within the hardware modules.

The foregoing descriptions of embodiments of the invention have been presented for purposes of illustration and description only. They are not intended to be exhaustive or to limit the invention to the forms disclosed. Accordingly, many modifications and variations may be apparent to practitioners skilled in the art. Additionally, the above disclosure is not intended to limit the invention. The scope of the invention is defined by the appended claims.

What is claimed is:

1. An annealing system comprising:
a first heat-treating bar operable to be heated to a first curing temperature;
a second heat-treating bar operable to be heated to a second curing temperature;
a first actuator operable to conform the first heat-treating bar to a top surface of a first photovoltaic strip of two cascaded photovoltaic strips, wherein the two cascaded photovoltaic strips comprise the first photovoltaic strip with a first busbar on a bottom surface opposite the top surface of the first photovoltaic strip and a second photovoltaic strip with a second busbar on a top surface of the second photovoltaic strip, wherein the first and the second busbars overlap in an overlap region, and wherein the first heat-treating bar is configured to be aligned along the overlap region of the two cascaded photovoltaic strips; and
a second actuator configured to conform the second heat-treating bar to a bottom surface of the second photovoltaic strip opposite the top surface of the second photovoltaic strip, wherein the second heat-treating bar is configured to be aligned along the overlap region of the two cascaded photovoltaic strips.

2. The annealing system of claim 1, wherein a respective heat-treating bar comprises a compression spring operable to supply compression between the heat-treating bar and a corresponding actuator while the corresponding actuator presses the respective heat-treating bar against the two cascaded photovoltaic strips.

3. The annealing system of claim 1, further comprising a string platform comprising an opening, wherein the string platform is configured to support the two cascaded photovoltaic strips with the overlap region positioned over the opening so that the second heat-treating bar is able to access the bottom surface of the second photovoltaic strip.

4. The annealing system of claim 3, wherein the string platform is configured to support a string of cascaded photovoltaic strips, wherein the string extends in a first direction and wherein busbars of photovoltaic strips in the string extend in a second direction perpendicular to the first direction, and wherein the string platform comprises a series of two or more openings with spacing in the first direction equal to a spacing between overlap regions of neighboring sections of the string of cascaded photovoltaic strips.

5. The annealing system of claim 3, wherein the first heat-treating bar is oriented overhead the string platform, and wherein the second heat-treating bar is oriented below the string platform.

6. The annealing system of claim 4, wherein the first heat-treating bar is mounted to a bottom surface of an overhead platform comprising a plurality of first heat-treating bars oriented overhead the string platform, and wherein the plurality of first heat-treating bars have a spacing in the first direction equal to the spacing between overlap regions of neighboring sections of the string of cascaded photovoltaic strips.

7. The annealing system of claim 5, wherein the second heat-treating bar is mounted on an underside platform comprising a plurality of second heat-treating bars oriented below the string platform, wherein the plurality of second heat-treating bars have a spacing in the first direction equal to the spacing between overlap regions of neighboring sections of the string of cascade photovoltaic strips and are aligned with the series of two or more openings.

8. The annealing system of claim 3, further comprising an actuator operable to move the string platform to align a second section of a string to the first and second heat-treating bars, wherein the string comprises the two cascaded photovoltaic strips and a second pair of cascaded photovoltaic strips, and wherein the second section comprises the second pair of cascaded photovoltaic strips.

9. The annealing system of claim 1, further comprising an actuator operable to move the first and second heat-treating bars to align with a second overlap region of a second set of cascaded photovoltaic strips.

10. The annealing system of claim 1, wherein a respective heat-treating bar includes an electric heat source, operable to heat a surface of the respective heat-treating bar to a target curing temperature.

11. The annealing system of claim 1, wherein the first curing temperature or the second curing temperature is approximately 160 degrees Celsius.

12. The annealing system of claim 10, further comprising at least one fan operable to prevent the heat-treating bar from reaching a temperature above an upper threshold.

* * * * *